United States Patent [19]

Ritchie et al.

[11] 4,420,882

[45] Dec. 20, 1983

[54] METHOD OF MOUNTING TILT LATCH ZERO INSERTION FORCE CONNECTOR TO A SUBSTRATE

[75] Inventors: Leon T. Ritchie, Mechanicsburg; Clair W. Snyder, Jr., York, both of Pa.; Thurston H. Toeppen, Poughkeepsie, N.Y.; John A. Woratyla, Camp Hill, Pa.

[73] Assignee: AMP Incorporated, Harrisburg, Pa.

[21] Appl. No.: 414,230

[22] Filed: Sep. 2, 1982

Related U.S. Application Data

[62] Division of Ser. No. 240,524, Mar. 4, 1981, Pat. No. 4,372,634.

[51] Int. Cl.[3] .............................................. H05K 3/30

[52] U.S. Cl. ..................................................... 29/837

[58] Field of Search ............ 29/837, 838; 339/103 R, 339/103 M, 217 S

[56] References Cited

U.S. PATENT DOCUMENTS 3,363,224 1/1968 Gluntz .
3,858,960 1/1975 Kunkle et al. .
4,083,615 4/1978 Volinskie .
4,243,288 1/1981 Lucius et al. .
4,269,466 5/1981 Huber .
4,330,164 5/1982 Pittman et al. .

*Primary Examiner*—Howard N. Goldberg
*Assistant Examiner*—Carl J. Arbes
*Attorney, Agent, or Firm*—Russell J. Egan

[57] ABSTRACT

A connector assembly is disclosed having both the capability of being mass terminated and for effecting zero insertion force mating with conductive holes of a printed circuit board or the like. The subject connector system includes a pair of identical housing members, each of which receives a plurality of terminals therein, and a pair of hermaphroditic cover members. Each housing member is an elongated member of insulative material having a mating face and a plurality of terminal receiving passages opening onto the mating face. The terminals each have a first end lying within the housing and capable of effecting mass termination of individual conductors by insulation displacing means and a second end extending from the mating face of the housing in resilient cantilever beam fashion. Each of the hermaphroditic cover members encloses a respective one of the housing members to form a complete subassembly. Each subassembly is mated to a circuit board in a tilted condition with the resilient beams of the terminals extending into the conductive holes of the circuit board. The subassemblies are then rotated relative to each other to latch the cover members together while bringing the beams into contact with the side walls of the conductive holes thereby effecting contact therewith while securing the connector assembly in the printed circuit board.

2 Claims, 4 Drawing Figures

METHOD OF MOUNTING TILT LATCH ZERO INSERTION FORCE CONNECTOR TO A SUBSTRATE

This is a division of application Ser. No. 240,524 filed Mar. 4, 1981 now U.S. Pat. No. 4,372,634 issued 2.8.83.

BACKGROUND OF THE INVENTION

1. The Field Of The Invention

The present invention relates to a connector assembly formed by a pair of housings which are preloaded with terminals having a first mating insulation displacing end within the housings and a second resilient cantilever beam end extending from the housings and pair of hermaphroditic cover members each of which forms a subassembly with a respective housing. The subassemblies are positioned in apertures in a printed circuit board in a tilted condition and rotated relative to each other to secure the subassemblies together bringing the beams into engagement with conductive holes in the printed circuit board.

2. The Prior Art

The present invention concerns a continuation of the product line of connector assemblies described in U.S. Pat. No. 4,243,288, the disclosure of which is incorporated herein by reference. The connector assembly of the noted patent provides means for efficient and cost productive mass termination of multiple conductors in a single operation. It does not provide for a zero insertion force engagement of the connector assembly and, in particular, for mating with conductive holes of a printed circuit board. In fact the terminals disclosed in this patent have a mating end of a pin receptacle type, disclosed in U.S. Pat. No. 3,363,224 with an insulation displacing conductor engaging opposite end of the type disclosed in U.S. patent application Ser. No. 927,720, filed July 25, 1978.

SUMMARY OF THE INVENTION

The present invention is intended to employ many of the principles described in the above-mentioned U.S. Pat. No. 4,143,288 to produce an electrical connector assembly having the advantages of both insulation displacement termination of multiple conductors and zero insertion force engagement of the connector with conductive holes of a printed circuit board or the like. The subject connector includes a pair of identical housing members, each having a mating face and a plurality of parallel spaced terminal passages opening onto the mating face. One side of each passage towards the rear of the passage is open providing access to a terminal positioned therein. Each terminal has an insulation displacing configuration lying in the open portion and a resilient cantilevered beam extending beyond the mating face. The connector also includes a pair of mating hermaphroditic cover members which enclose the rear surfaces of a respective housing member to form a subassembly. The covers also include legs which are passed through apertures in the circuit board, the beams extending into but not engaging the conductive holes. The subassemblies are then pivoted relative to each other and the circuit board to rotate the cover members into engagement and bring the beams of the terminals into engagement with the conductive holes in the printed circuit board.

It is therefore an object of the present invention to produce an improved electrical connector assembly which will provide the benefits of cost efficient mass termination of multiple conductors in a single operation as well as zero insertion force mating with a circuit board.

It is another object of the present invention to produce an improved electrical connector assembly utilizing insulation displacing terminals preloaded and partly exposed in respective housings with hermaphroditic covers providing a subassembly to both enclose the terminal carrying housings and to bring the terminals into engagement with walls of conductive holes in a printed circuit board or the like.

It is still another object of the present invention to produce a connector assembly which has pairs of housing members and related covers which are rotated in a subassembly to relocate beam portions of terminals carried by the housing members into engagement with conductive walls of holes in a printed circuit board or the like.

It is yet another object of the present invention to produce a connector assembly which is fully servicable in that damaged terminals can be readily replaced.

It is a further object of the present invention to produce an improved electrical connector which can be readily and economically produced.

The means for accomplishing the foregoing objects and other advantages of the present invention will become apparent to those skilled in the art from the following detailed description taken with reference to the accompanying drawings.

DETAILED DESCRIPTION OF THE PREFERRED EMBODIMENT

Figure 1:
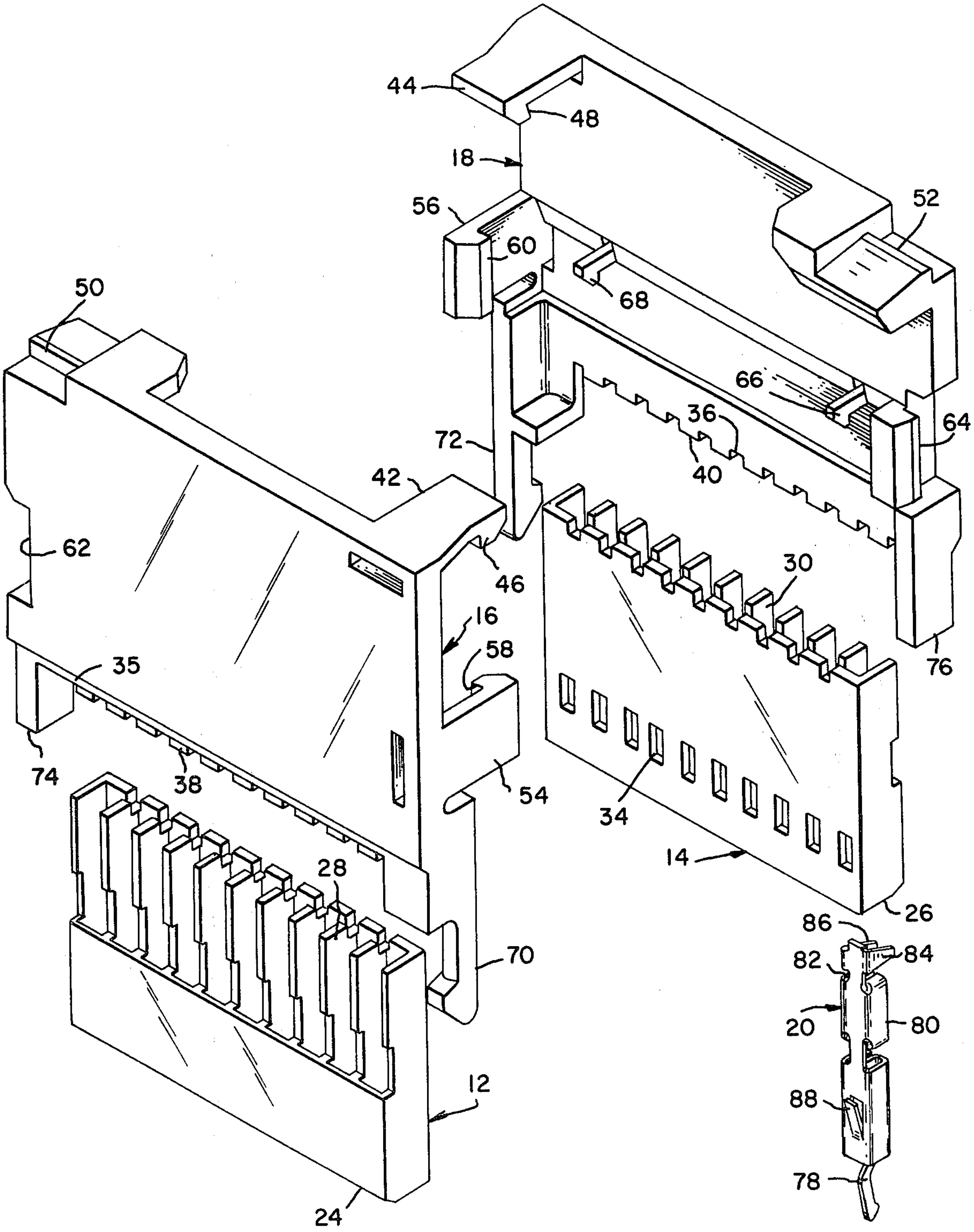
FIG. 1 is an exploded perspective view of the subject electrical connector assembly.

The subject electrical connector assembly 10 includes a pair of housing members 12, 14, a pair of mating hermaphroditic cover members 16, 18 and a plurality of electrical terminals 20 for terminating a like plurality of respective conductors 22. Each housing 12, 14 is an identical elongated member of rigid plastic material having a mating face 24, 26 with a plurality of terminal passages 28, 30 opening therein in an aligned spaced row of parallel passages. The sides of each housing are open at the rear end so that the passages 28, 30 are enclosed at their forward ends and are channel-spaced opening outwardly at their rear ends. The housings are each also provided with a plurality of apertures 32, 34 each aligned with a respective passage 28, 30 and spaced rearwardly of the respective mating face 24, 26.

Each hermaphroditic cover member 16, 18 has a housing engaging edge portion 35, 36 each including a plurality of tines 38, 40. Each tine 38, 40 is aligned to be received in a respective passage 28, 30 of the adjacent housing member 12, 14. Each cover member 16, 18 further includes, at one rear corner, a depending first latching leg 42, 44 having a shoulder 46, 48 directed towards the opposite housing engaging edge portion. The opposite rear corner of each cover member has a rear step 50, 52 which receives the shoulder 48, 46, respectively of the opposite cover member. On the side of each cover member, intermediate the front and rear edges, there is a second latching leg 54, 56 each with an inwardly directed shoulder 58, 60 positioned to engage in a side step 64, 62 on the opposite side of the opposing cover member. Each cover member is further provided with a pair of inwardly directed latching lugs 66, 68 adapted to engage the rear edge of the respective housing to form a subassembly of a housing and a cover member. Each cover member is further provided with a mounting leg 70, 72, on one side edge and a standoff abutment 74, 76 on the opposite side edge. The mounting legs 70, 72 are of sufficient length to extend beyond the respective mating faces 24, 26 of the housings while the abutments 74, 76 are substantially coplanar with the mating faces.

Each terminal 20 includes a forward mating end which is formed as a cantilever beam 78. The terminal 20 further includes insulation displacing rear portion formed by a pair of upstanding walls 80, 82 defining a channel therebetween. Each end of each wall is inwardly directed with the opposing pairs of end portions defining insulation piercing slots therebetween. This portion of the terminal is fully described in application Ser. No. 927,720 filed July 25, 1978, the disclosure of which is incorporated herein by reference. Each terminal is further provided with a pair of conductor engaging ears 84, 86 and a mounting lance 88.

Figure 2:
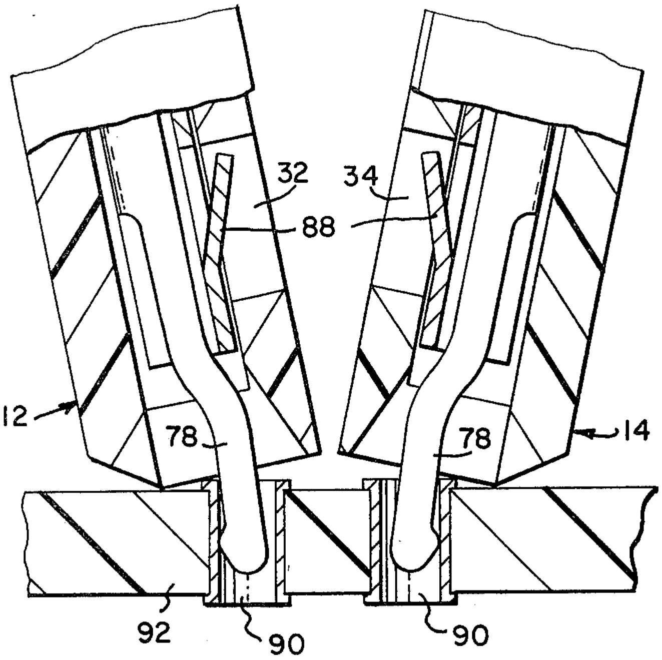
FIG. 2 is a detailed side elevation, partly in section, showing the initial engagement of the subject invention with a circuit board.
Figure 4:
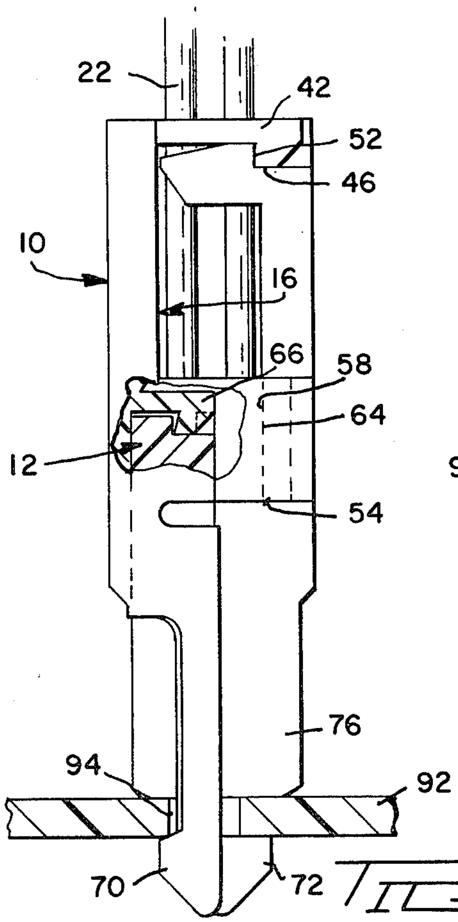
FIG. 4 is a side elevation, partially in section, of the assembled and mounted electrical connector according to the present invention.
Figure 3:
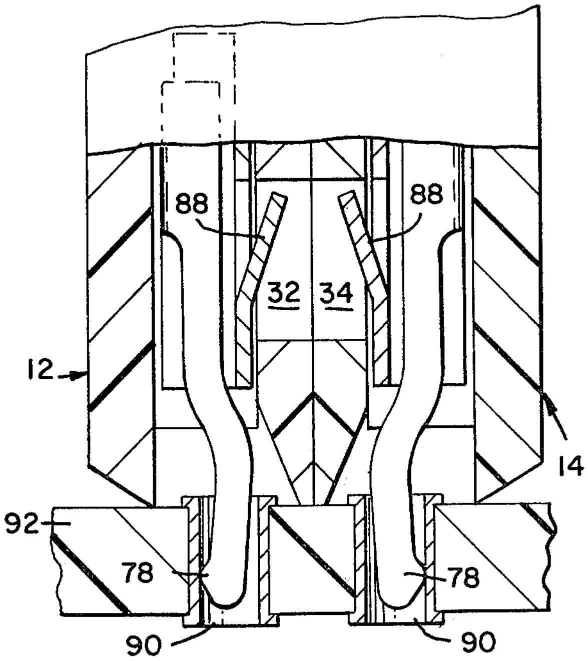
FIG. 3 is a detailed side view, partly in section, showing the subject invention in a fully engaged and mounted condition.

The subject housings 12, 14 are each preloaded with a plurality of terminals 20. Each terminal has its beam portion 78 extending from the respective mating face 24, 26 and the sidewalls 80, 82 of the insulation piercing portion lying in the open rear end of the respective passages 28, 30. The individual conductors 22 are terminated by the respective terminals in the manner described in the previously mentioned U.S. Pat. No. 4,243,288 and the cover members 16, 18 are then applied by placing the leading edges 35, 36 against the housings so that the tines 38, 40 enter into the passageways 28, 30. It will be noted from FIG. 4 that when the cover members are assembled with the respective housings, the lugs 66, 68 engage rear portions of the housings to form a subassembly. The thus formed subassemblies of the subject connector are then applied to the circuit board by first inserting the beams 78 of the respective terminals 20 into the conductive holes 90 of a circuit board 92. The holes 90 are preferably plated through holes but also could be holes lined with grommets or other like inserts (not shown). The respective subassemblies of the connector are then pivoted relative to one another, as seen in FIGS. 2 and 3 to bring the beams 78 into engagement with the walls of the holes 90 and to bring the cover members 16, 18 into a locking engagement, as shown in FIG. 4. It will also be noted from FIG. 4 that the mounting legs 70, 72 pass through mounting apertures 94 in the circuit board and secure the connector in position.

The present invention may be subject to many modifications and changes without departing from the spirit or essential characteristics thereof. The present embodiment should therefore be considered in all respects as illustrative and not restrictive of the scope of the invention.

What is claimed is:

1. A method of effecting zero insertion force mating of an electrical connector with a plurality of conductive holes in an array in a circuit board or the like, comprising the steps of:

forming a pair of subassemblies each comprising a housing having a mating face, a plurality of terminals in said housing each with a resilient beam portion extending from said mating face, and a cover member;

mating said subassemblies with said circuit board at a tilted angle with respect to the plane of said circuit board, said beams entering said conductive holes making only incidental contact therewith; and rotating said subassemblies relative to each other and to said circuit board to bring said subassemblies into abutting position and said beams into contact with walls of said conductive holes.

2. A method according to claim 1 further comprising: engaging mounting legs of said subassemblies in mounting apertures in said circuit board in said tilted condition, said mounting legs, upon rotation of said subassemblies, coming into locking engagement with said circuit board whereby said connector assembly is securely held thereon.

* * * * *